(12) United States Patent
Chen et al.

(10) Patent No.: US 9,812,570 B2
(45) Date of Patent: Nov. 7, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chih-Fen Chen, Hsinchu (TW); Chui-Ya Peng, Hsinchu (TW); Ching Yu, Hsinchu (TW); Pin-Hen Lin, New Taipei (TW); Yen Chuang, Taipei (TW); Yuh-Ta Fan, Shin Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/788,522

(22) Filed: Jun. 30, 2015

(65) Prior Publication Data

US 2017/0005196 A1 Jan. 5, 2017

(51) Int. Cl.
*H01L 29/78* (2006.01)
*H01L 29/66* (2006.01)
*H01L 21/336* (2006.01)
*H01L 29/08* (2006.01)
*H01L 29/165* (2006.01)

(52) U.S. Cl.
CPC ...... *H01L 29/7848* (2013.01); *H01L 29/0847* (2013.01); *H01L 29/6659* (2013.01); *H01L 29/66636* (2013.01); *H01L 29/7834* (2013.01); *H01L 29/165* (2013.01); *H01L 29/665* (2013.01); *H01L 29/7835* (2013.01)

(58) Field of Classification Search
CPC ............. H01L 29/7848; H01L 29/0653; H01L 29/0847; H01L 29/1608; H01L 29/161; H01L 29/165; H01L 29/665; H01L 29/66636
USPC ... 257/77, 190, 192, 288, E21.409, E21.431, 257/E21.619, E29.255; 438/285, 590
See application file for complete search history.

(56) References Cited

U.S. PATENT DOCUMENTS

| | | | |
|---|---|---|---|
| 8,299,535 B2 | 10/2012 | Chan et al. | |
| 8,404,538 B2* | 3/2013 | Lai | H01L 21/3247 257/190 |
| 8,853,060 B1 | 10/2014 | Lai et al. | |
| 8,912,068 B2* | 12/2014 | Lee | H01L 29/0847 438/222 |
| 8,946,060 B2 | 2/2015 | Cheng et al. | |
| 9,012,277 B2* | 4/2015 | Flachowsky | H01L 21/823807 257/190 |
| 2006/0237746 A1* | 10/2006 | Orlowski | H01L 29/165 257/192 |
| 2008/0067557 A1 | 3/2008 | Yu et al. | |
| 2009/0001418 A1* | 1/2009 | Kim | H01L 29/0847 257/190 |

(Continued)

FOREIGN PATENT DOCUMENTS

TW 201445618 A 12/2014

*Primary Examiner* — Dao H Nguyen
(74) *Attorney, Agent, or Firm* — Maschoff Brennan

(57) ABSTRACT

A semiconductor device includes a substrate, a liner, and an epitaxy structure. The substrate has a recess. The liner is disposed in the recess. The liner is denser than the substrate. The epitaxy structure is disposed in the recess. The liner is disposed between the epitaxy structure and the substrate.

20 Claims, 5 Drawing Sheets

(56) References Cited

U.S. PATENT DOCUMENTS

| | | | |
|---|---|---|---|
| 2009/0032880 A1* | 2/2009 | Kawaguchi | H01L 21/3065 257/369 |
| 2012/0146057 A1* | 6/2012 | Hsu | H01L 21/823807 257/77 |
| 2012/0280251 A1* | 11/2012 | Dube | H01L 29/66628 257/77 |
| 2012/0319203 A1 | 12/2012 | Cheng et al. | |
| 2014/0353714 A1* | 12/2014 | Loubet | H01L 29/7848 257/190 |
| 2016/0071978 A1* | 3/2016 | Javorka | H01L 29/1054 257/190 |

* cited by examiner

SEMICONDUCTOR DEVICE AND MANUFACTURING METHOD THEREOF

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. When a semiconductor device, such as a metal-oxide-semiconductor field-effect transistor (MOSFET), is scaled down through various technology nodes, high k dielectric material and metal are adopted to form a gate stack. In addition, to further enhance the performance of MOSFET devices, stress may be introduced in the channel region of a MOSFET device to improve carrier mobility. For example, the strained structures utilizing epitaxial structure may be used to enhance carrier mobility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
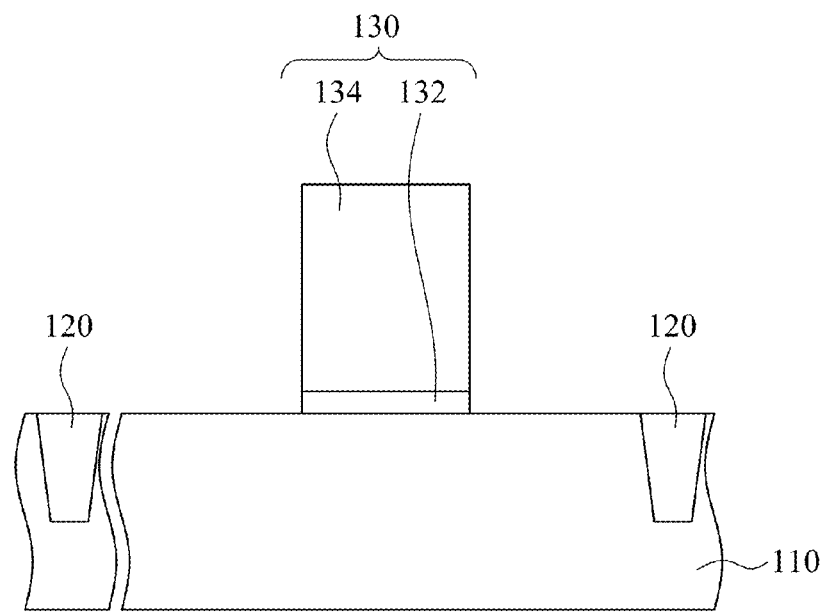
FIGS. 1A to 1F are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A semiconductor device and the method of manufacturing the semiconductor device are provided in accordance with various exemplary embodiments. The variations of the embodiments are discussed. FIGS. 1A to 1F are cross-sectional views of a method for manufacturing a semiconductor device at various stages in accordance with some embodiments of the present disclosure. The semiconductor device illustrates an integrated circuit, or portion thereof, that can include memory cells and/or logic circuits. The semiconductor device can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method shown in FIGS. 1A to 1F, and some of the steps described below can be replaced or eliminated, for additional embodiments of the method. It is further understood that additional features can be added in the semiconductor device, and some of the features described below can be replaced or eliminated, for additional embodiments of the semiconductor device.

Reference is made to FIG. 1A. A substrate 110 is provided. In FIG. 1A, the substrate 110 is a semiconductor substrate including silicon. Alternatively, the substrate 110 includes an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some embodiments, the semiconductor substrate may include a doped epitaxy layer. In some other embodiments, the silicon substrate may include a multilayer compound semiconductor structure.

The substrate 110 may include various doped regions depending on design types (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 110, in a P-well structure, in an N-well structure, in a dual-well structure, or using a raised structure.

An isolation structure 120 is formed in the substrate 110 for isolating various active regions. The formation of isolation structure 120 may include etching a trench in the substrate 110 and filling the trench by insulator materials such as silicon oxide, silicon nitride, or silicon oxynitride. The filled trench may have a multi-layer structure such as a thermal oxide liner layer with silicon nitride filling the trench. In some embodiments, the isolation structure 120 may be created using a process sequence such as: growing a pad oxide, forming a low pressure chemical vapor deposition (LPCVD) nitride layer, patterning an opening using photoresist and masking, etching a trench in the substrate 110, optionally growing a thermal oxide trench liner to improve the trench interface, filling the trench with CVD oxide, using chemical mechanical planarization (CMP) to etch back, and using nitride stripping to leave the isolation structure 120. In some embodiments, the isolation structure 120 is local oxidation of silicon (LOCOS) and/or shallow trench isolation (STI) structures, to define and electrically isolate the various regions.

A gate stack 130 is formed on the substrate 110. The gate stack 130 includes a gate dielectric 132 and a gate electrode 134. The gate dielectric 132 may include silicon oxide, silicon nitride, a high-k dielectric, or other suitable materials. The high-k dielectric is a dielectric featuring a dielectric constant (k) higher than the dielectric constant of $SiO_2$, i.e. k is greater than about 3.9. The high-k dielectric layer may include a binary or ternary high-k film such as $HfO_x$. Alternatively, the high-k dielectric layer may optionally include other high-k dielectrics such as lanthanum oxide (LaO), aluminum oxide (AlO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium zirconium oxide (HfZrO), hafnium lanthanum oxide (HfLaO), hafnium silicon oxide (HfSiO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), aluminum oxide ($Al_2O_3$), silicon nitride ($Si_3N_4$), oxynitrides, or other suitable materials. The gate dielectric 132 is formed by a suitable process such as an atomic layer deposition (ALD), chemical vapor deposition (CVD), physical vapor deposition (PVD), thermal oxidation, UV-ozone oxidation, or combinations thereof.

In some embodiments, the gate electrode 134 is formed on the gate dielectric 132. In some embodiments, the gate electrode 134 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate electrode 134 could include a conductive layer having a proper work function, therefore, the gate electrode 134 can also be referred to as a work function layer. The work function layer includes any suitable material, such that the layer can be tuned to have a proper work function for enhanced performance of the associated device. For example, if a p-type work function metal (p-metal) is desired, titanium nitride (TiN) or tantalum nitride (TaN) may be used. On the other hand, if an n-type work function metal (n-metal) is desired, tantalum (Ta), titanium aluminum (TiAl), titanium aluminum nitride (TiAlN), or tantalum carbon nitride (TaCN), may be used. The work function layer may include doped conducting oxide materials. The gate electrode 134 may include other conductive materials, such as aluminum (Al), copper (Cu), tungsten (W), metal alloys, metal silicide, other suitable materials, or combinations thereof. For example, where the gate electrode 134 includes a work function layer, another conductive layer can be formed over the work function layer.

Figure 1B:
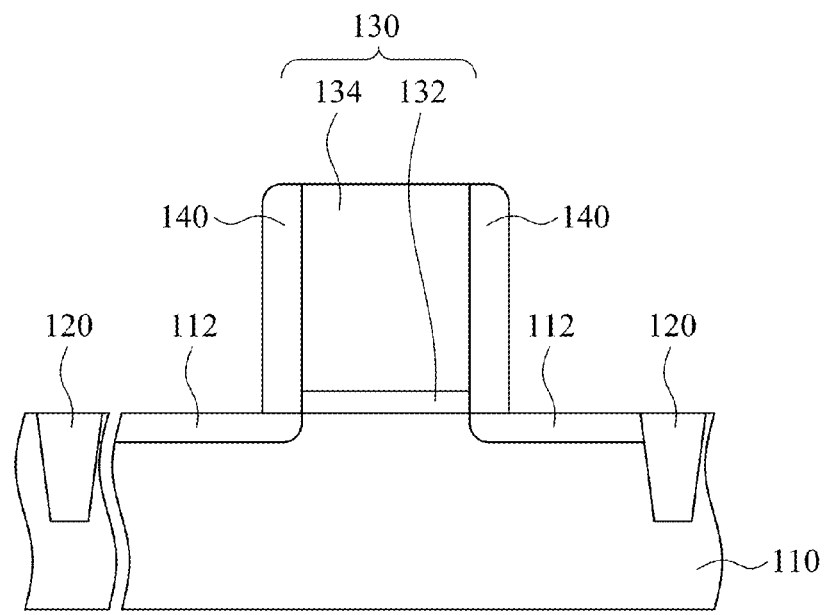

Reference is made to FIG. 1B. Two doping layers 112, such as lightly doped source/drain (LDD) regions are formed in the substrate 110 so as to form source/drain regions. In some embodiments, the doping layers 112 are formed in the substrate 110, interposed by the gate electrode 134. The doping layers 112 are aligned with sidewalls of the gate electrode 134. In other words, the gate electrode 134 acts as the implantation mask so that the edges of the doping layers 112 are substantially aligned with the edges of the gate electrode 134. The doping layers 112 are formed by an ion implantation process, diffusion process, other suitable process, or combinations thereof. In some embodiments, the doping layers 112 for an NFET device are doped with an n-type dopant, such as phosphorus or arsenic. In some other embodiments, the doping layers 112 for a PFET device are doped with a p-type dopant, such as boron or $BF_2$.

Two spacers 140 are formed at sidewalls of the gate electrode 134. In some embodiments, at least one of the spacers 140 includes a liner oxide layer and a nitride layer over the liner oxide layer (not shown). In alternative embodiments, at least one of the spacers 140 may include one or more layers, including oxide, silicon nitride, silicon oxynitride and/or other dielectric materials, and may be formed using a deposition method, such as plasma enhanced chemical vapor deposition (PECVD), low-pressure chemical vapor deposition (LPCVD), sub-atmospheric chemical vapor deposition (SACVD), or the like. The formation of spacers 140 may include blanket forming spacer layers, and then performing etching steps to remove the horizontal portions of the spacer layers. The remaining vertical portions of the gate spacer layers form spacers 140. The spacers 140 may have a thickness ranging from about 4 to about 6 nm, in accordance with some embodiments.

Figure 1C:
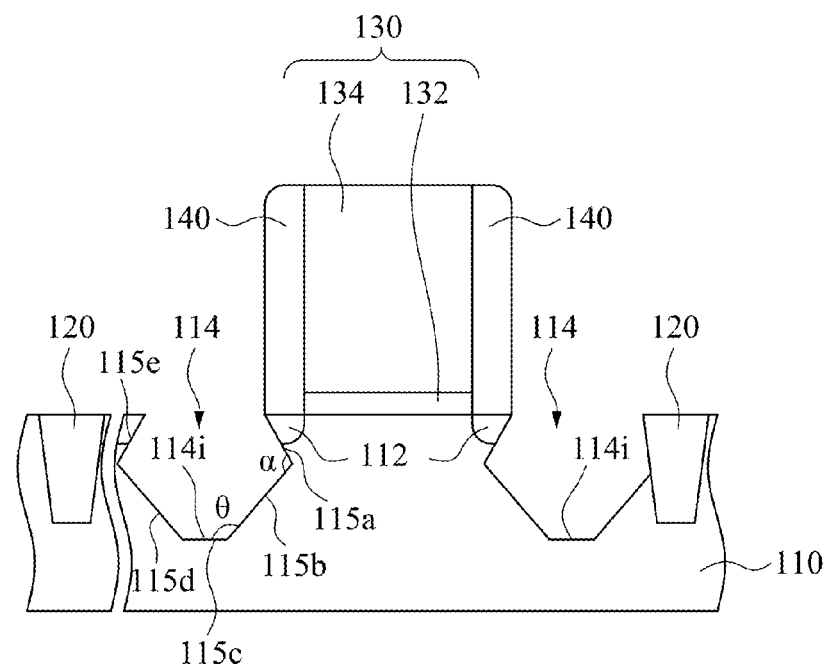

Reference is made to FIG. 1C. Two recesses 114 are respectively formed at opposite sides of the gate stack 130 by etching the substrate 110. The gate stack 130 and the spacers 140 act as an etching mask in the formation of the recesses 114. The etching process includes a dry etching process, a wet etching process, or combinations thereof. In FIG. 1C, the etching process utilizes a combination dry and wet etching. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. For the dry etching process, the etching gas may be selected from, for example, HBr, $Cl_2$, $Cl_4$, $SF_6$, $NF_3$, $CH_2F_2$, $N_2$, $O_2$, Ar, He, and combinations thereof. The etching gas may be a single-etching step or may include a plurality of etching steps. In the recessing step, the plasma of the etching gas is generated. For example, the dry etching process may utilize an etching pressure of about 1 mT to about 200 mT, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In some embodiments, the dry etching process includes an etching pressure of about 1 mT to about 200 mT, a source power of about 200 W to about 2000 W, an RF bias voltage of about 0 V to about 100 V, a NF$_3$ gas flow rate of about 5 sccm to about 30 sccm, a Cl$_2$ gas flow rate of about 0 sccm to about 100 sccm, a He gas flow rate of about 0 sccm to about 500 sccm, and an Ar gas flow rate of about 0 sccm to about 500 sccm. In some other embodiments, the etching process includes an etching pressure of about 1 mT to about 200 mT, a source power of about 200 W to about 2000 W, an RF bias voltage of about 0 V to about 100 V, a SF$_6$ gas flow rate of about 5 sccm to about 30 sccm, a Cl$_2$ gas flow rate of about 0 sccm to about 100 sccm, a He gas flow rate of about 0 sccm to about 500 sccm, and an Ar gas flow rate of about 0 sccm to about 500 sccm. The wet etching solutions may include NH$_4$OH, HF (hydrofluoric acid), TMAH (tetramethylammonium hydroxide), other suitable wet etching solutions, or combinations thereof. In some embodiments, the wet etching process first implements a 100 parts water to 1 part HF concentration of an HF solution at room temperature, and then implements a NH$_4$OH solution at a temperature of about 20° C. to about 60° C. In some other embodiments, the wet etching process first implements a 100:1 concentration of an HF solution at room temperature, and then implements a TMAH solution at a temperature of about 20° C. to about 60° C.

One skilled in the art will realize that the dimensions of the recesses 114 recited throughout the description are merely examples, and will change if different formation technologies are used. In FIG. 1C, the recesses 114 have diamond shapes in the cross-sectional view. The cross-sectional view shape of the recesses 114 are determined by various factors such as the crystal orientation of the substrate 110, the type of etchant, the etching conditions, and the like. In some embodiments, after the etching process, a pre-cleaning process may be performed to clean the recesses 114 with a hydrofluoric acid (HF) solution or other suitable solution.

In FIG. 1C, portions of the doping layers 112 are removed during the formation of the recesses 114. Hence, after the formation of the recesses 114, another portions of the doping layers 112 are respectively disposed between the gate stack 130 and the recesses 114. In other words, one of the doping layers 112 is disposed beneath the gate stack 130 and adjacent to one of the recesses 114.

After the formation of the recesses 114, inner surfaces 114i of the substrate 110 are respectively exposed to the recesses 114, which the inner surfaces 114i are respectively inside the recesses 114. The inner surfaces 114i may have a high roughness, and some metal impurities are also formed in the inner surfaces 114i. The high roughness may cause the variation in the volumes of the recesses 114 throughout the respective die and wafer, and in turn cause the variation in the stresses in the channels of the semiconductor device. As a result, the high roughness may cause the variation in the performance (such as the variation in drive currents) of the semiconductor device. Hence, process conditions for the etching are adjusted to reduce the roughness in the inner surfaces 114i of the recesses 114. For example, the pressure of the etching gas, the bias voltage, the temperatures of the substrate 110, the magnetic field for generating the plasma, and the like, may be adjusted to improve the roughness of the inner surfaces 114i. Although the roughness may be reduced through the adjustment of etching process conditions, the roughness may still be high.

In FIG. 1C, the etching profile of the recesses 114 enhances performance of the semiconductor device. In greater detail, the etching profile of the recesses 114 defines source and drain regions of the semiconductor device, and the etching profile of one of the recesses 114 is defined by facets 115a, 115b, 115c, 115d, and 115e of the substrate 110. The facets 115a, 115b, 115d, and 115e may be referred to as shallow facets, and the facets 115c may be referred to as bottom facets. In FIG. 1C, the etching profile of the recesses 114 is defined by facets 115a, 115b, 115d, and 115e in a {111} crystallographic plane of the substrate 110, and facets 115c in a {100} crystallographic plane of the substrate 110. An angle α between the shallow facets 115a and 115b (and/or between the shallow facets 115d and 115e) is from about 45.0° to about 80.0°, and an angle θ between the facets 115b (or 115d) and 115c is from about 50.0° to about 70.0°.

Figure 1D:
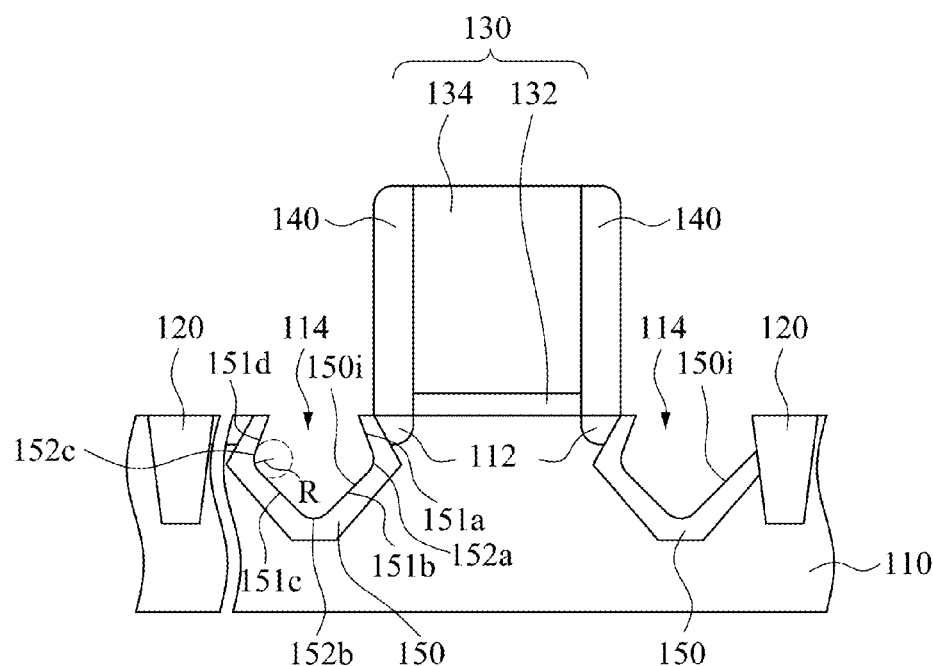

Reference is made to FIG. 1D. After the formation of the recesses 114, a surface treatment on the inner surfaces 114i of the recesses 114 is performed to respectively form a plurality of liners 150 on the inner surfaces 114i of the recesses 114. For example, a reactive gas can be provided to the inner surfaces 114i to form the liners 150. In some embodiments, the reactive gas may be a chloride-containing gas, such as dichlorosilane (DCS, SiH$_2$Cl$_2$). When the DCS gas is introduced in the recesses 114, the chloride thereof can react with the metal impurities disposed in the inner surfaces 114i and form metal-chloride gas, which is then evaporated. Furthermore, the silicon of the DCS gas is deposited on the inner surfaces 114i and forms the liners 150. Therefore, the liners 150 are made of silicon. In some embodiments, the liners 150 are formed at a temperature of about 700° C. to about 900° C., such that the liners 150 are denser than the substrate 110, which is made of silicon. As the depositing amount of silicon is increased, the liners 150 become thicker, and the inner surfaces 150i of the liners 150 becomes smooth. That is, a roughness of the inner surfaces 150i is smoother than the roughness of the inner surfaces 114i.

In some embodiments, the formation profile of the liner 150 is defined by facets 151a, 151b, 151c, and 151d. A corner 152a is formed between the facets 151a and 151b, a corner 152b is formed between the facets 151b and 151c, and a corner 152c is formed between the facets 151c and 151d. The facet 151a is near the facet 115a (see FIG. 1C), the facet 151b is near the facet 115b (see FIG. 1C), the facet 151d is near the facet 115c (see FIG. 1C), the facet 151e is near the facet 115d (see FIG. 1C), and the corner 152b is near the facet 115c. In some embodiments, the corners 152a, 152b, and 152c can be round corners, and a radius of curvature R of at least one of the corners 152a, 152b, and 152c is about 20 nm to about 60 nm. With this configuration, the formation control of the source and drain regions formed in the recesses 114 at the following process can be improved.

The terms "about" may be applied to modify any quantitative representation which could permissibly vary without resulting in a change in the basic function to which it is related. For example, the radius of curvature R as disclosed therein being in a range from about 20 nm to about 60 nm may permissibly be somewhat less than 20 nm if the formed corners 152a, 152b, and 152c are still round corners.

Figure 1E:
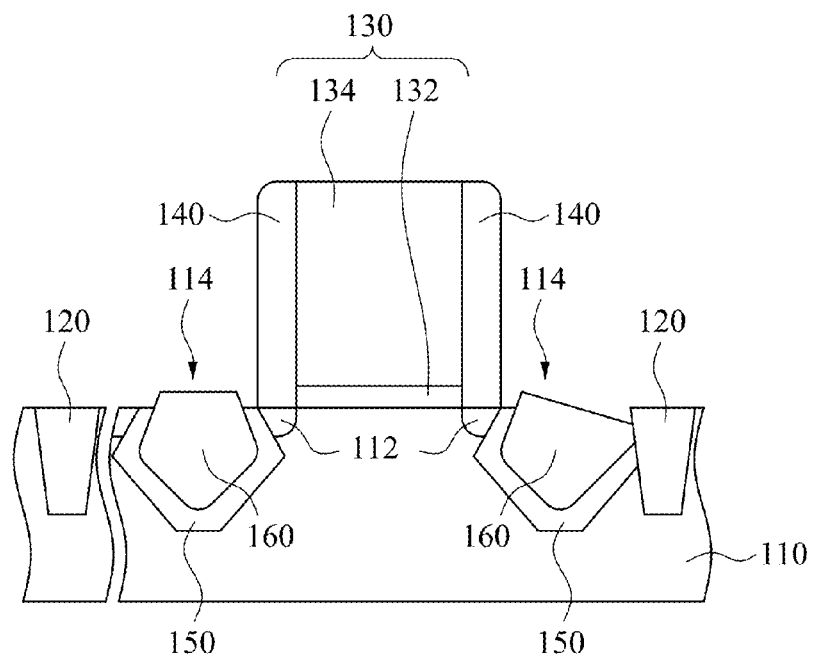

Reference is made to FIG. 1E. A semiconductor material is deposited in the recesses 114 to form source and drain features. The source and drain features may alternatively be referred to as raised source and drain regions. For example, the semiconductor material, such as silicon germanium (SiGe), is epitaxially grown in the recesses 114 to respectively form epitaxy structures 160. In some embodiments, the epitaxy may be a selective epitaxial growth (SEG) process, in which the semiconductor material is grown in the recesses 114, and not on dielectric materials. In some other embodiments, the epitaxy may include CVD deposition techniques (e.g., vapor-phase epitaxy (VPE) and/or ultrahigh vacuum CVD (UHV-CVD)), molecular beam epitaxy, other suitable epitaxy processes, or combinations thereof. The epitaxy process may use gaseous and/or liquid precursors, which may interact with the composition of the substrate 110. The epitaxy structures 160 may have a lattice constant greater than the lattice constant of the substrate 110. The precursor for growing SiGe may include germane ($GeH_4$, which provides germanium), dichlorosilane (DCS, which provides silicon), and the like. Desired p-type or n-type impurities may be, or may not be, doped while the epitaxial growth proceeds. The doping may be achieved by an ion implantation process, plasma immersion ion implantation (PIII) process, gas and/or solid source diffusion process, other suitable process, or combinations thereof. The epitaxy structures 160 may further be exposed to annealing processes, such as a rapid thermal annealing process. After being annealed, SiGe will try to restore its lattice constant, thus introducing compressive stresses to the channel regions of the resulting PMOS devices. Throughout the description, the SiGe epitaxy regions are alternatively referred to as SiGe stressors. In alternative embodiments, other semiconductor materials such as silicon carbon (SiC) may be grown to generate tensile stress in the channels of the resulting semiconductor device, which may be an n-type semiconductor device.

Reference is made to FIGS. 1C to 1E. In FIG. 1C, the inner surfaces 114i of the recesses 114 has high roughness, which makes the inner surfaces 114i uneven. The uneven inner surfaces 114i makes the control of the formation of the epitaxy structures 160 difficult. As a result, the thickness variation of the epitaxy structures 160 is large, which could lead to wider variation in the semiconductor device performance. However, in FIG. 1D, the liners 150 are formed on the inner surfaces 114i. The inner surfaces 150i thereof has a smoother roughness than the inner surfaces 114i. Therefore, the formation control of the epitaxy structures 160 of FIG. 1E can be improved, and the performance of the semiconductor device can also be improved.

Furthermore, in FIG. 1E, the liner 150 is disposed between the epitaxy structure 160 and the substrate 110. In other words, the liner 150 spatially separates the epitaxy structure 160 and the substrate 110. Moreover, the liner 150 also spatially separates the epitaxy structure 160 and the doping layers 112.

Figure 1F:
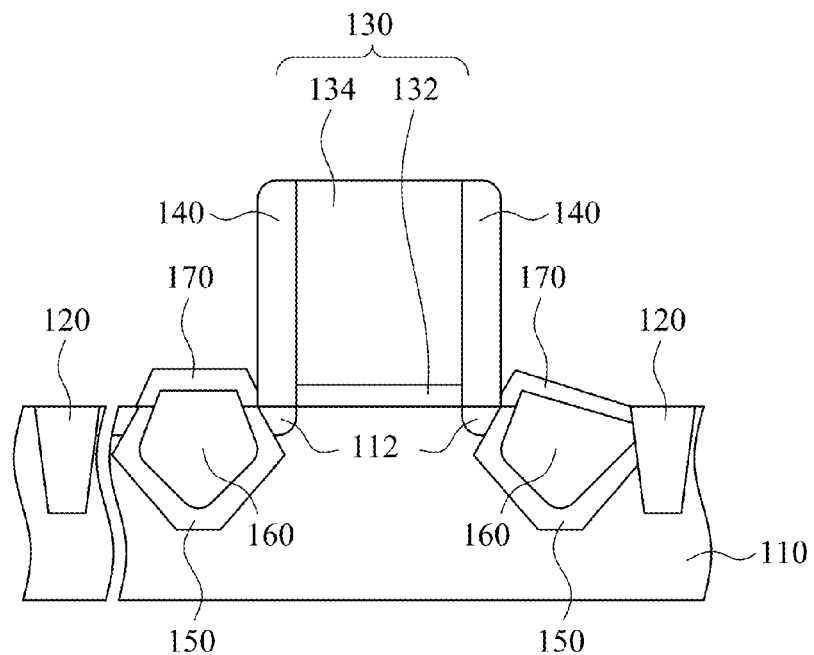

Reference is made to FIG. 1F. In some embodiments, a plurality of silicide regions 170 may be optionally formed on the epitaxy structures 160 by a self-aligned silicide (salicide) process. For example, the salicide process may include two steps. First, a metal material may be deposited via sputtering on the epitaxy structures 160 at a temperature between about 500° C. to about 900° C., causing a reaction between the underlying silicon and metal material to form the silicide regions 170. Then, the un-reacted metal material may be etched away. The silicide regions 170 may include a material selected from titanium silicide, cobalt silicide, nickel silicide, platinum silicide, erbium silicide, and palladium silicide. The silicide regions 170 may be formed on the epitaxy structures 160 to reduce contact resistance.

Figure 2:
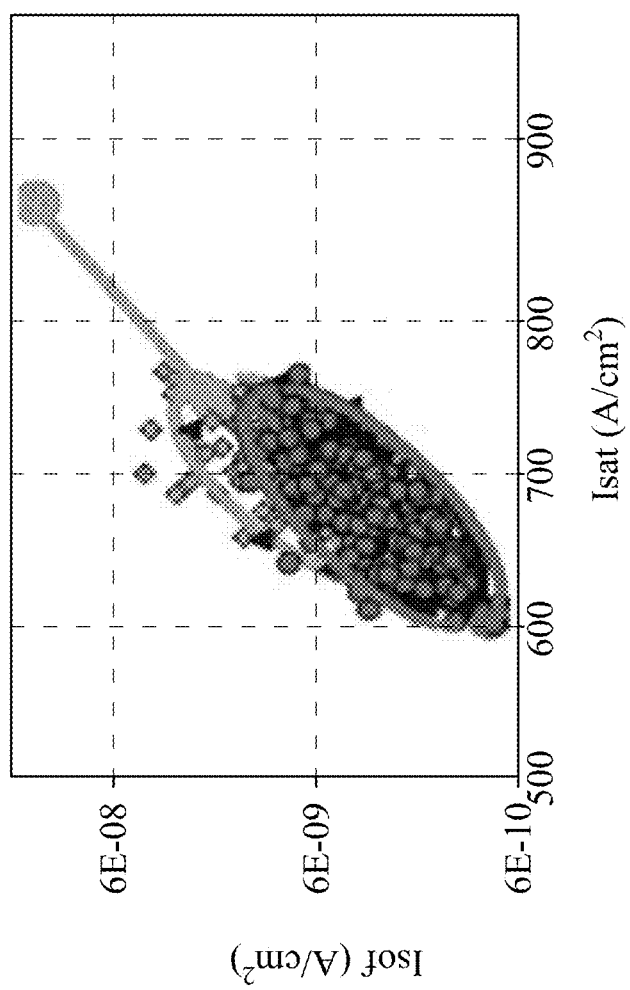
FIG. 2 is a graph representing the relationships of source-off current (Isof) (A/cm$^2$) vs. saturation current (Isat) (A/cm$^2$) for semiconductor devices with/without providing DCS gas during the process in FIG. 1D.

FIG. 2 is a graph representing the relationships of source-off current (Isof) ($A/cm^2$) vs. saturation current (Isat) ($A/cm^2$) for semiconductor devices with/without providing DCS gas during the process in FIG. 1D. The vertical axis of the graph shows source-off current (Isof), and the horizontal axis shows saturation current (Isat). The solid diamonds (reference) depict the semiconductor device without providing DCS gas, the solid triangles depict the semiconductor device with providing DCS gas for 5 seconds, and the solid circles depict the semiconductor device with providing DCS gas for 7 seconds. Without providing the DCS gas, the Ion-Isof was about 99.7% to spice target, with providing the DCS gas for 5 seconds, the Ion-Isof was about 103.8% to spice target, and with providing the DCS gas for 7 seconds, the Ion-Isof was about 106.0% to spice target.

Figure 3:
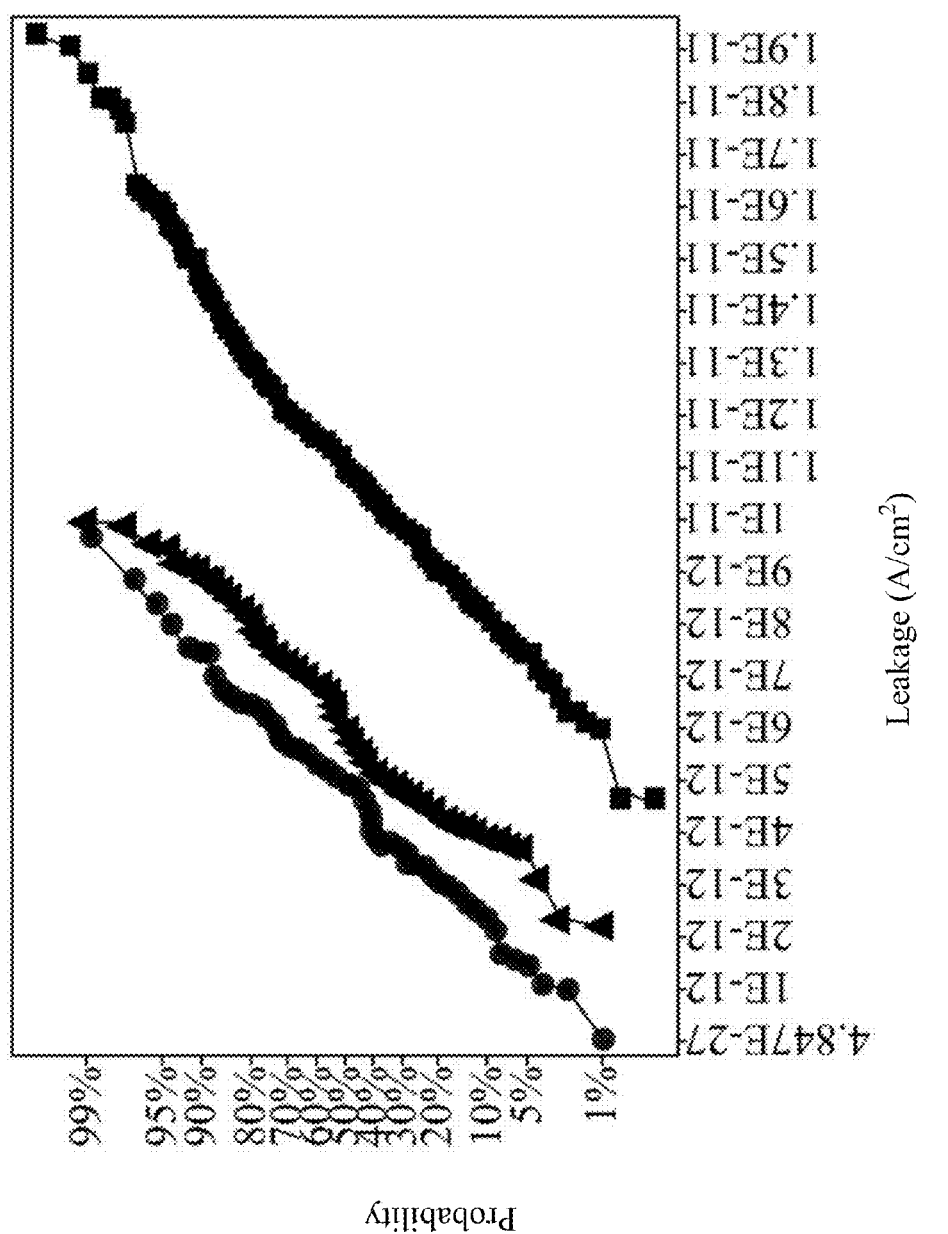
FIG. 3 is a graph representing the relationships of probability (%) vs. leakage (A/cm$^2$) for semiconductor devices with/without providing DCS gas during the process in FIG. 1D.

FIG. 3 is a graph representing the relationships of probability (%) vs. leakage ($A/cm^2$) for semiconductor devices with/without providing DCS gas during the process in FIG. 1D. The vertical axis of the graph shows probability (%), and the horizontal axis shows leakage ($A/cm^2$). The solid squares (reference) depict the semiconductor device without providing DCS gas, the solid triangles depict the semiconductor device with providing DCS gas for 5 seconds, and the solid circles depict the semiconductor device with providing DCS gas for 7 seconds.

According to the aforementioned embodiments, a surface treatment is performed on the inner surface of the recess. The surface treatment can remove the metal impurities disposed at the inner surface of the recess, and also form the liner thereon. The liner is denser than the substrate, and the inner surface of the liner has a smoother roughness than the inner surface of the recess. Therefore, the formation control of the epitaxy structure can be improved, and the performance of the semiconductor device can also be improved.

According to some embodiments of the present disclosure, a semiconductor device includes a substrate, a liner, and an epitaxy structure. The substrate has a recess. The liner is disposed in the recess. The liner is denser than the substrate. The epitaxy structure is disposed in the recess. The liner is disposed between the epitaxy structure and the substrate.

According to some embodiments of the present disclosure, a method for manufacturing a semiconductor device including forming a recess in a substrate. A surface treatment is performed on an inner surface of the recess to form a liner thereon. An epitaxy structure is formed in the recess and on the liner.

According to some embodiments of the present disclosure, a method for manufacturing a semiconductor device including etching a recess in a substrate. A liner is formed in the recess to remove metal impurities on an inner surface of the recess. An epitaxy structure is formed in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate having a plurality of facets defining a recess, the facets having a first facet, a second facet, and a bottom facet, the first facet and the second facet defining a first corner, the second facet and the bottom facet defining a second corner, the first corner being in a position higher than the second corner;

a liner disposed in the recess, the liner defining a round corner pointing toward the first corner, wherein a radius of curvature of the round corner is about 20 nm to about 60 nm; and an epitaxy structure disposed in the recess, wherein the liner is disposed between the epitaxy structure and the substrate.

2. The semiconductor device of claim 1, further comprising:

a gate stack disposed on or above the substrate and adjacent to the recess.

3. The semiconductor device of claim 2, further comprising:

an isolation structure disposed in the substrate, wherein the recess is disposed between the isolation structure and the gate stack.

4. The semiconductor device of claim 2, wherein two of the recesses are respectively disposed at opposite sides of the gate stack.

5. The semiconductor device of claim 2, wherein the substrate has a doping region disposed between the recess and the gate stack.

6. The semiconductor device of claim 1, wherein the liner and the substrate are made of substantially the same material.

7. The semiconductor device of claim 1, further comprising:

a silicide region disposed on or above the epitaxy structure.

8. The semiconductor device of claim 1, wherein the round corner is rounder than the first corner.

9. The semiconductor device of claim 1, wherein the first corner is lower than a top surface of the substrate, and the first facet extends from the first corner to the top surface of the substrate.

10. The semiconductor device of claim 1, wherein the liner is denser than the substrate.

11. A method for manufacturing a semiconductor device, comprising:

forming a recess in a substrate such that the recess is defined by a plurality of facets of the substrate, the facets having a first facet, a second facet, and a bottom facet, the first facet and the second facet defining a first corner, the second facet and the bottom facet defining a second corner, the first corner being in a position higher than the second corner;

performing a surface treatment on an inner surface of the recess to form a liner thereon, wherein performing the surface treatment is such that the liner defines a round corner pointing toward the first corner, such that a radius of curvature of the round corner is about 20 nm to about 60 nm, and such that the liner and the substrate are made of substantially the same material; and forming an epitaxy structure in the recess and on the liner.

12. The method of claim 11, wherein the surface treatment comprises:

providing a reactive gas to the inner surface to form the liner.

13. The method of claim 12, wherein the reactive gas is dichlorosilane (DCS, $SiH_2Cl_2$).

14. The method of claim 11, further comprising:

forming a gate stack on the substrate, wherein the recess is disposed adjacent to the gate stack.

15. The method of claim 14, further comprising:

forming an isolation structure in the substrate, wherein the recess is formed between the isolation structure and the gate stack.

16. The method of claim 14, further comprising:

forming a doping region in the substrate and between the gate stack and the recess.

17. The method of claim 11, further comprising:

forming a silicide region on or above the epitaxy structure.

18. The method of claim 11, wherein the liner and the substrate are made of silicon.

19. A method for manufacturing a semiconductor device, comprising:

etching a recess in a substrate such that the recess is defined by a plurality of facets of the substrate, the facets having a first facet, a second facet, and a bottom facet, the first facet and the second facet defining a first corner, the second facet and the bottom facet defining a second corner, the first corner being in a position higher than the second corner;

forming a liner in the recess to remove metal impurities on an inner surface of the recess, wherein forming the liner is such that the liner defines a round corner pointing toward the first corner, such that a radius of curvature of the round corner is about 20 nm to about 60 nm, and such that the liner and the substrate are made of substantially the same material; and forming an epitaxy structure in the recess.

20. The method of claim 19, wherein forming the liner comprises:

providing a chloride-containing gas into the recess to react with the metal impurities.

* * * * *